United States Patent [19]

Polyzois et al.

[11] Patent Number: 5,432,922

[45] Date of Patent: Jul. 11, 1995

[54] DIGITAL STORAGE SYSTEM AND METHOD HAVING ALTERNATING DEFERRED UPDATING OF MIRRORED STORAGE DISKS

[75] Inventors: Christos A. Polyzois, White Plains; Daniel M. Dias, Mahopac, both of N.Y.; Anupam K. Bhide, Foster City, Calif.

[73] Assignee: International Business Machines Corporation, Armonk, N.Y.

[21] Appl. No.: 110,467

[22] Filed: Aug. 23, 1993

[51] Int. Cl.$^6$ .................... G06F 13/10; G06F 12/06
[52] U.S. Cl. .................... 395/425; 395/575; 395/600; 371/10.1; 371/40.1; 364/DIG. 1
[58] Field of Search .................... 371/40.1, 11.3, 10.1; 395/575, 425, 600, 275; 364/DIG. 1

[56] References Cited

U.S. PATENT DOCUMENTS

| | | | |
|---|---|---|---|
| 4,722,085 | 1/1988 | Flora et al. | 371/40.1 |
| 5,212,784 | 5/1993 | Sparks | 395/575 |
| 5,230,073 | 7/1993 | Gausmann et al. | 395/600 |
| 5,297,258 | 3/1994 | Hale et al. | 395/275 |

*Primary Examiner*—Rebecca L. Rudolph
*Assistant Examiner*—Sheela N. Nadig
*Attorney, Agent, or Firm*—Ronald L. Drumheller

[57] ABSTRACT

A fault-tolerant high performance mirrored disk subsystem is described which has an improved disk writing scheme that provides high throughput for random disk writes and at the same time guarantees high performance for disk reads. The subsystem also has an improved recovery mechanism which provides fast recovery in the event that one of the mirrored disks fails and during such recovery provides the same performance as during non-recovery periods.

Data blocks or pages which are to be written to disk are temporarily accumulated and sorted (or scheduled) into an order (or schedule) which can be written to disk efficiently, which in a preferred embodiment is in accordance with the physical location on disk at which each such block will be written. This also generally corresponds to an order which is encountered by a write head during a physical scan of a disk. The disks of a mirrored pair are operated out of phase with each other, so that one will be in read mode while the other is in write mode. Updated blocks are written out to the disk that is in write mode in sorted order, while guaranteed read performance is provided by the other disk that is in read mode. When a batch of updates has been applied to one disk of a mirrored pair, the mirrored pair switch their modes, and the other disk is updated. Preferably the updates are kept in a non-volatile memory, which furthermore advantageously may be made fault-tolerant as well.

During recovery a pair of spare alternating mirrored disks is introduced to which new updates are directed, while a background scan process copies data from the surviving disk to the new mirrored pair.

18 Claims, 8 Drawing Sheets

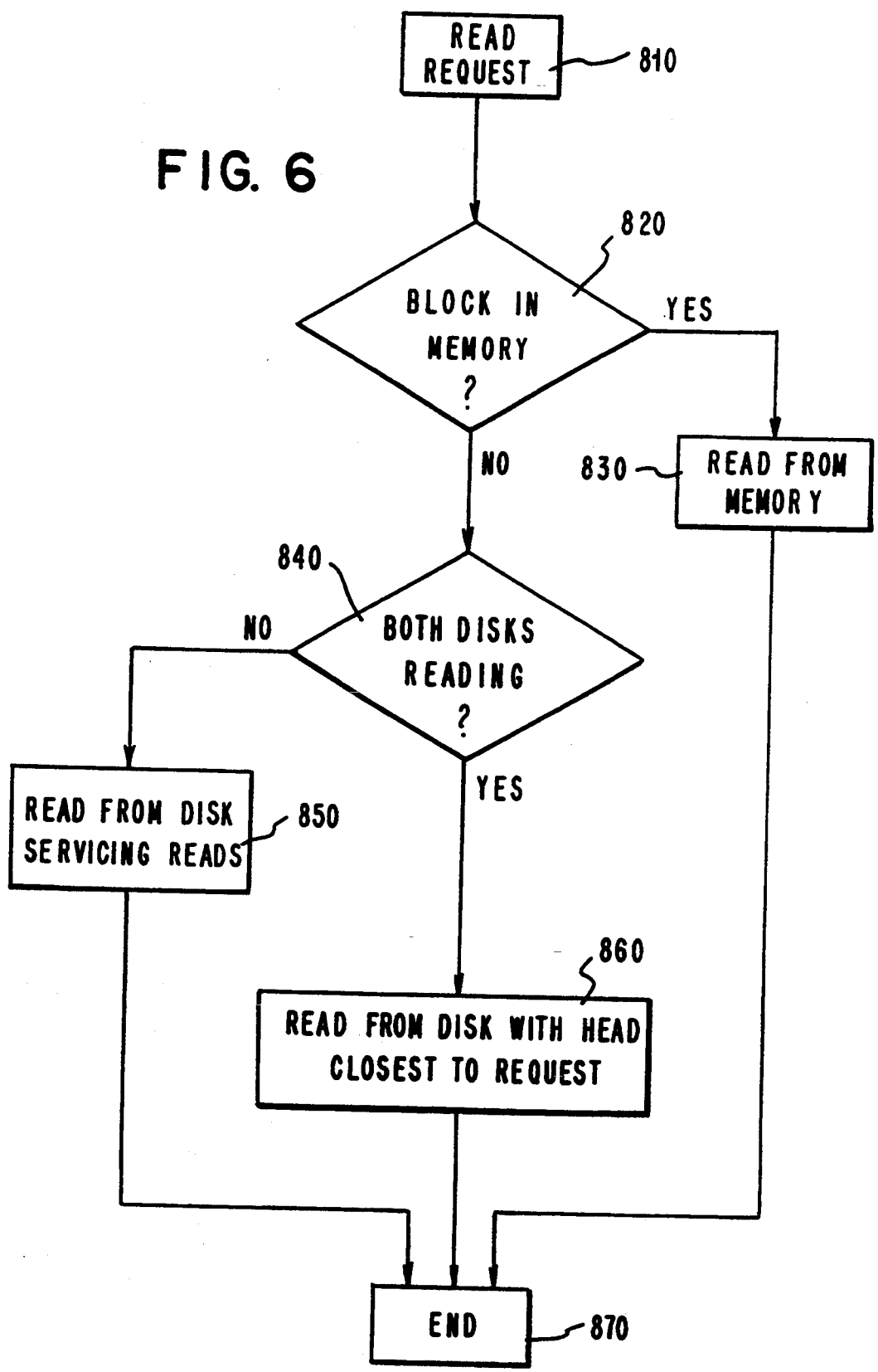

DIGITAL STORAGE SYSTEM AND METHOD HAVING ALTERNATING DEFERRED UPDATING OF MIRRORED STORAGE DISKS

FIELD OF THE INVENTION

This invention relates generally to fault tolerant digital storage disk systems and more particularly to digital storage disk systems of the mirrored disk type in which reliability is provided by storing digital information in duplicate on two separate storage disks.

BACKGROUND OF THE INVENTION

As the requirements for On-Line Database Transaction Processing (OLTP) grow, high transaction rates on the order of thousands of transactions per second must be supported by OLTP systems. Furthermore, these applications call for high availability and fault tolerance. In applications such as OLTP, a large fraction of the requests are random accesses to data. Since a large fraction of the data resides on disks, the disk sub-systems must therefore support a high rate of random accesses, on the order of several thousands of random accesses per second. Furthermore, the disks need to be fault tolerant to meet the availability needs of OLTP.

Whenever a random access is made to a disk, in general the disk must rotate to a new orientation such that the desired data is under a disk arm and the read/write head on that disk arm must also move along the arm to a new radial position at which the desired data is under the read/write head. Unfortunately performance of this physical operation, and therefore random disk Input/Output (I/O) performance is not improving as fast as other system parameters such as CPU MIPS. Therefore, applications such as OLTP, where random access to data predominates, have become limited by this factor, which is referred to in this art as being disk arm bound. In systems which are disk arm bound, the disk cost is becoming an ever larger fraction of the system cost. Thus, there is a need for a disk sub-system which can support a larger rate of random accesses per second with a better price-performance characteristic than is provided by transitional disk systems.

Both mirrored disk systems and RAID disk systems (for Redundant Array of Independent Disks) have been used to provide fault tolerant disk systems for OLTP. In a mirrored disk system, the information on each disk is duplicated on a second (and therefore redundant) disk. In a RAID array, the information at corresponding block locations on several disks is used to create a parity block on another disk. In the event of failure, any one of the disks in a RAID array can be reconstructed from the others in the array. RAID architectures require less disks for a specified storage capacity, but mirrored disks generally perform better. In an article entitled "An evaluation of redundant arrays of disks using an Amdahl 5890," SIGMETRICS Conference on Measurement and Modeling of Computer Systems, pp. 74–85, Boulder, Colo., May 1990, P. Chen et al. showed that mirrored disks are better than RAID-5 disk arrays for workloads with predominantly random writes (i.e., average read/write times for mirrored disk architectures are lower than for RAID-5 architectures when random read/writes predominate). RAID-5 architecture is described, for example, by D. Patterson et al. in "A case for redundant arrays of inexpensive disks," ACM SIGMOD Int'l Conf. on Management of Data, pp. 109–116, Chicago, Ill. (June 1988). However, mirrored disks do require that each data write be written on both disks in a mirrored pair. Thus, it is generally accepted that mirrored disk storage systems impose a performance penalty in order to provide the fault tolerance.

In a pending patent application Ser. No. 8-036636 filed Mar. 24, 1993, assigned to the same assignee as this patent application, entitled "Disk Storage Method and Apparatus for Converting Random Writes To Sequential Writes While Retaining Physical Clustering on Disk", some of the inventors of the present invention disclosed a method for improving the performance of a single disk or a RAID array. This is done by building sorted runs of disk writes in memory, writing them to a log disk, merging the sorted runs from the log disk and applying them in one pass through the data disks with large batch writes. This method has the advantage of largely converting random writes into sequential writes. One problem with this approach, however, is that when random disk reads interrupt the batch writes, either the disk read requests are delayed while the batch is written, leading to a penalty in disk read response time, or the batch writes are interrupted by the read, leading to a large loss in write (and therefore overall) throughput. Either way the overall performance suffers so that the benefit of creating sorted runs is offset largely whenever random disk reads are needed frequently during batch write operations.

The traditional method for recovery in a mirrored disk system is to copy the data from the surviving disk of the mirrored pair onto a spare backup disk. This is typically done by scanning the data on the surviving disk, and applying any writes that come in during this process to both disks. One problem with this approach is that it produces a significant degradation of the disk system performance during recovery.

SUMMARY OF THE INVENTION

Accordingly, it is an object of this invention to improve the performance of mirrored disk systems by largely eliminating the penalty normally resulting from the need to duplicate each disk write onto both disks of a mirrored pair of disks.

It is also an object to provide a mirrored disk subsystem that has improved performance for random disk I/O by converting random disk write I/O to close to sequential I/O.

It is still another object to improve the mirrored disk throughput without a penalty in read response time.

It is also an object to improve performance during the recovery process from a failed disk, by providing guaranteed performance to disk reads and writes during recovery, while retaining fast recovery.

These and further objects and advantages are achieved by this invention by providing a fault-tolerant disk storage subsystem of the mirrored disk type in which updates (i.e., data blocks to be written) to disk are accumulated and scheduled into successive batch runs of updates, the scheduling being done to produce an ordering which can be written efficiently to the mirrored disks. The updates preferably, but not necessarily, are accumulated in a memory in the disk controller, and the scheduling is preferably, but not necessarily, done by the disk controller for the mirrored disks. Preferably the memory is either non-volatile or fault-tolerant.

In a preferred embodiment, the scheduling is done by sorting the updates in accordance with the home locations of the updates on the mirrored disks (i.e., in accordance with the positions on disk at which the updates will be written). This is an ordering which also corresponds to a scan of a disk.

The disks in each mirrored pair are then operated out of phase with each other, one being in read mode while the other is in write mode. A batch of writes is efficiently applied each time to the disk in write mode in accordance with the scheduled order. Because the updates are copied onto each disk of the mirrored pair in accordance with the physical order on the disk, good performance is achieved for applying the writes.

Random writes are thus converted to largely sequential writes to disk and clustering of data on the disk is preserved. The average time to apply a write of a block using this method is typically less than half the time to apply a random write of a block on the disk, thus largely eliminating the problem of having to write a block twice to a pair of mirrored disks.

During this time, read requests are either handled by reading the data from the memory or from the disk that is in read mode. Thus, guaranteed performance to read requests is also achieved. When a batch of updates has been applied to one of the disks of a mirrored pair (i.e., the one in write mode), the disks switch modes of operation. There may also be a period of time when both disks are in read mode between these two modes of operation. Also there may be times when both disks of a mirrored pair are in write mode, as for example during loads and other large copying operations.

Recovery from failure of one disk of a mirrored pair of disks is handled by introducing a pair of spare mirrored disks that are operated using the alternating mirrors scheme. During recovery, new writes are directed to the spare disk pair. Reads are either handled from the surviving disk or the alternating mirror spare disk pair. In the background, spare cycles are used to scan and copy data from the surviving disk to the spare alternating mirror pair. This method provides fast recovery with guaranteed performance to both read and write requests during recovery.

BRIEF DESCRIPTION OF THE DRAWINGS

These, and further, objects, advantages, and features of the invention will be more apparent from the following detailed description of a preferred embodiment and the appended drawings in which:

FIG. 6 is a flow chart which shows the steps involved in processing a read request during normal operation;

DESCRIPTION OF A PREFERRED EMBODIMENT

Figure 1:
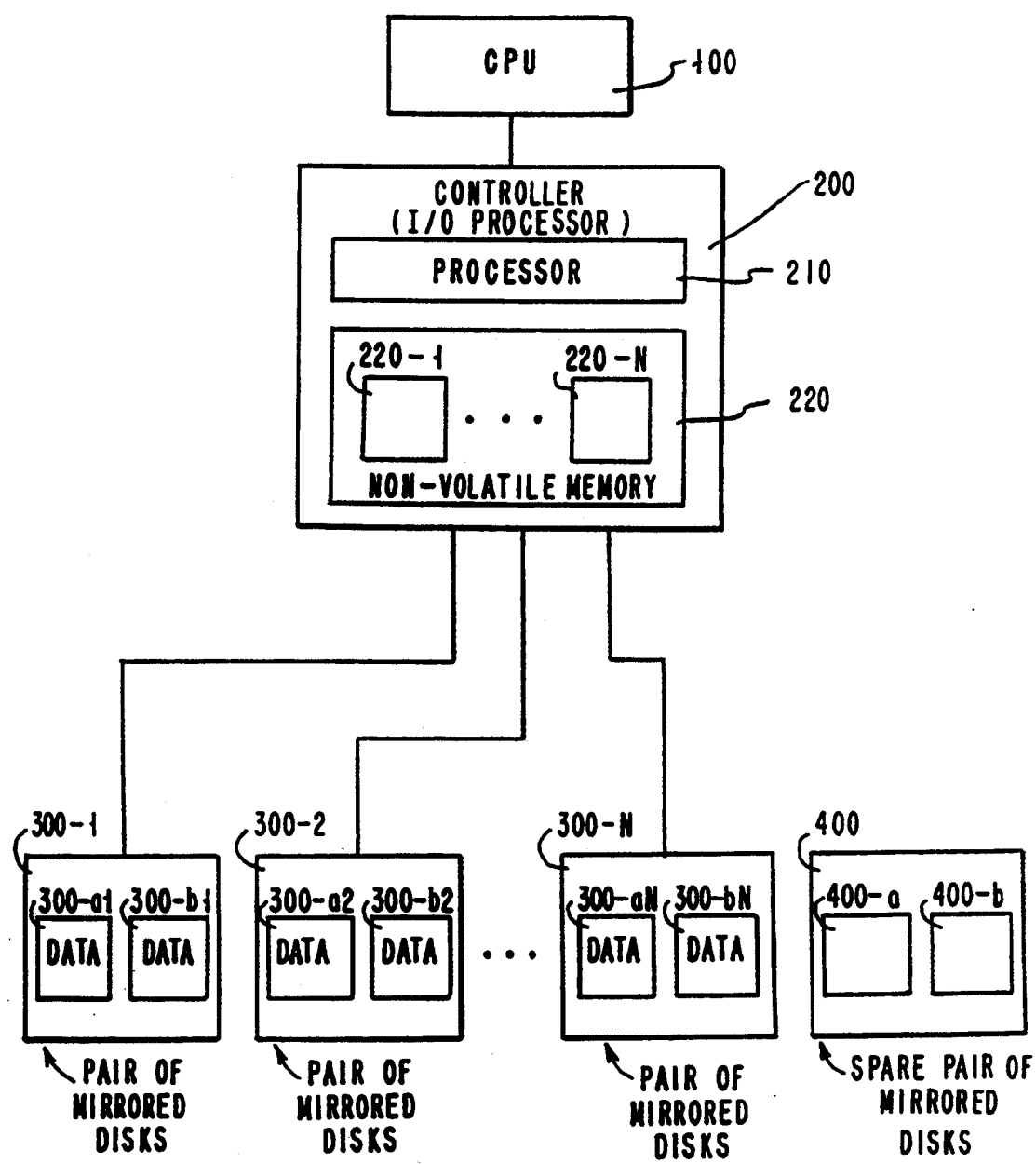
FIG. 1 is an overall block diagram of a preferred embodiment of this invention.

FIG. 1 is a block diagram of a preferred embodiment of a computer system which incorporates a disk storage subsystem having mirrored storage disks which are alternately updated in a batch fashion with accumulated updates that have been sorted for efficient writing (henceforth sometimes called AMDU for Alternating Mirrors with Deferred Updates) in accordance with this invention. It includes a controller or I/O processor (IOP) 200, a plurality of mirrored disk pairs 300-1 through 300-N, at least one spare pair of disks 400 and a central processing unit (CPU) 100. The controller 200 is connected to the CPU 100 and has a processor 210 and non-volatile memory 220. For simplicity we assume that the non-volatile memory is partitioned into regions 220-1 through 220-N, each corresponding to a mirrored pair.

Those skilled in the art will readily appreciate that the memory and controller need not constitute a separate physical subsystem as illustrated, but could instead be implemented with software running in the main computer system. Also the memory need not be non-volatile in order to achieve useful benefit from this invention and in many environments could be fault-tolerant as well (say through use of triple redundancy and a voting mechanism). The memory also need not be partitioned and there can be more than one spare pair of disks. The spare pair of disks is not used in normal operation, but is used in the event one of the mirrored disks fails.

Each mirrored disk pair consists of two disks labeled 300-a1 and 300-b1 for disk pair 300-1 (correspondingly 300-aN and 300-bN for disk pair 300-N). The two disks in each mirrored pair contain basically identical data. However, as will be better appreciated from the following description, updates to each mirrored pair of disks are NOT made simultaneously as would be the case with conventional mirrored disks. In accordance with the invention, updates are accumulated instead in the non-volatile memory 220 and sorted into batches of updates, which are applied to the two disks of a pair not simultaneously, but rather first to one and then to the other. Furthermore, while the same updates are eventually applied to each of the two disks of a pair (except for updates that have become obsolete because they have been further updated in non-volatile memory 220 before being applied to both disks), the batches of updates made to each disk individually generally are not identical since they are applied at different times and more recent blocks of data are included in the individual batch for each disk of a pair.

Figure 2:
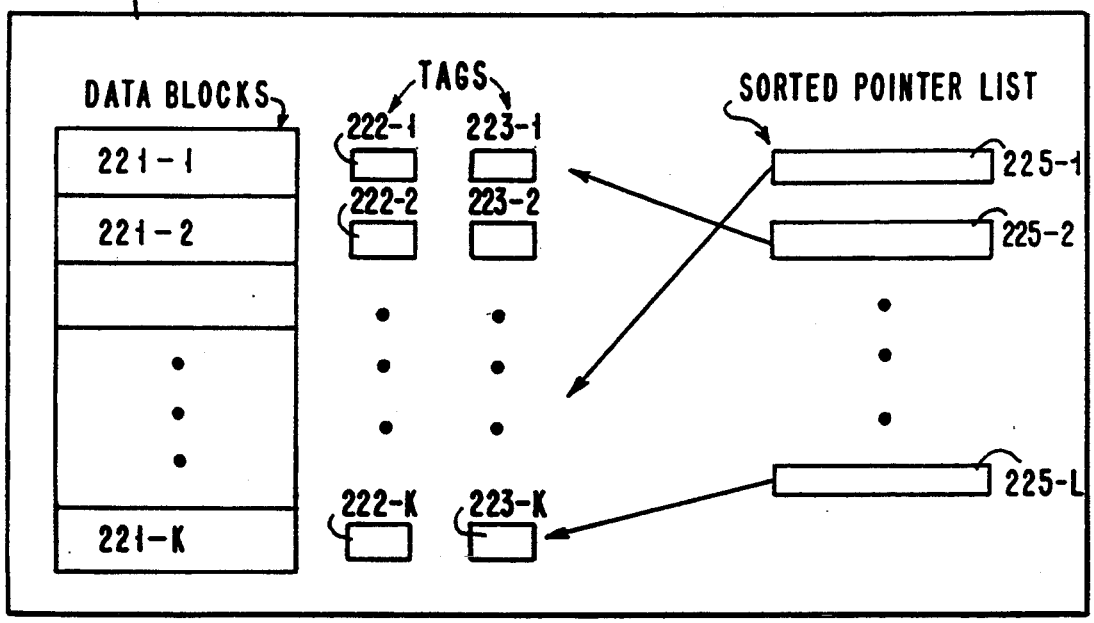
FIG. 2 illustrates a preferred organization of data in the non-volatile memory of the I/O processor.

FIG. 2 shows on region of non-volatile memory 220-i in more detail. The region has a number of data blocks labeled 221-1 through 221-k. Corresponding to each data block are two tags labeled 222-1 and 2223-1 (for block 221-1) through 222-k and 223-k (for block 221-k). The two tags for each data block correspond to the two disks in the mirrored pair and indicate whether the corresponding disk must still write the data block.

In each region of the non-volatile memory there is also a list of pointers labeled 225-1 through 225-L. Each pointer points to a data block in some region of non-volatile memory. The order of the pointers in the list indicates the order in which the blocks should be written on the disk to achieve efficiency.

The non-volatile memory acts as a cache for data blocks to be written to disk. Those skilled in the art will readily appreciate that this cache may be managed like any other cache, such as by using a hash table (to determine which blocks are present in the cache) and a free list (to chain free blocks). The hash table and the free list are not shown in FIG. 2.

Figure 3:
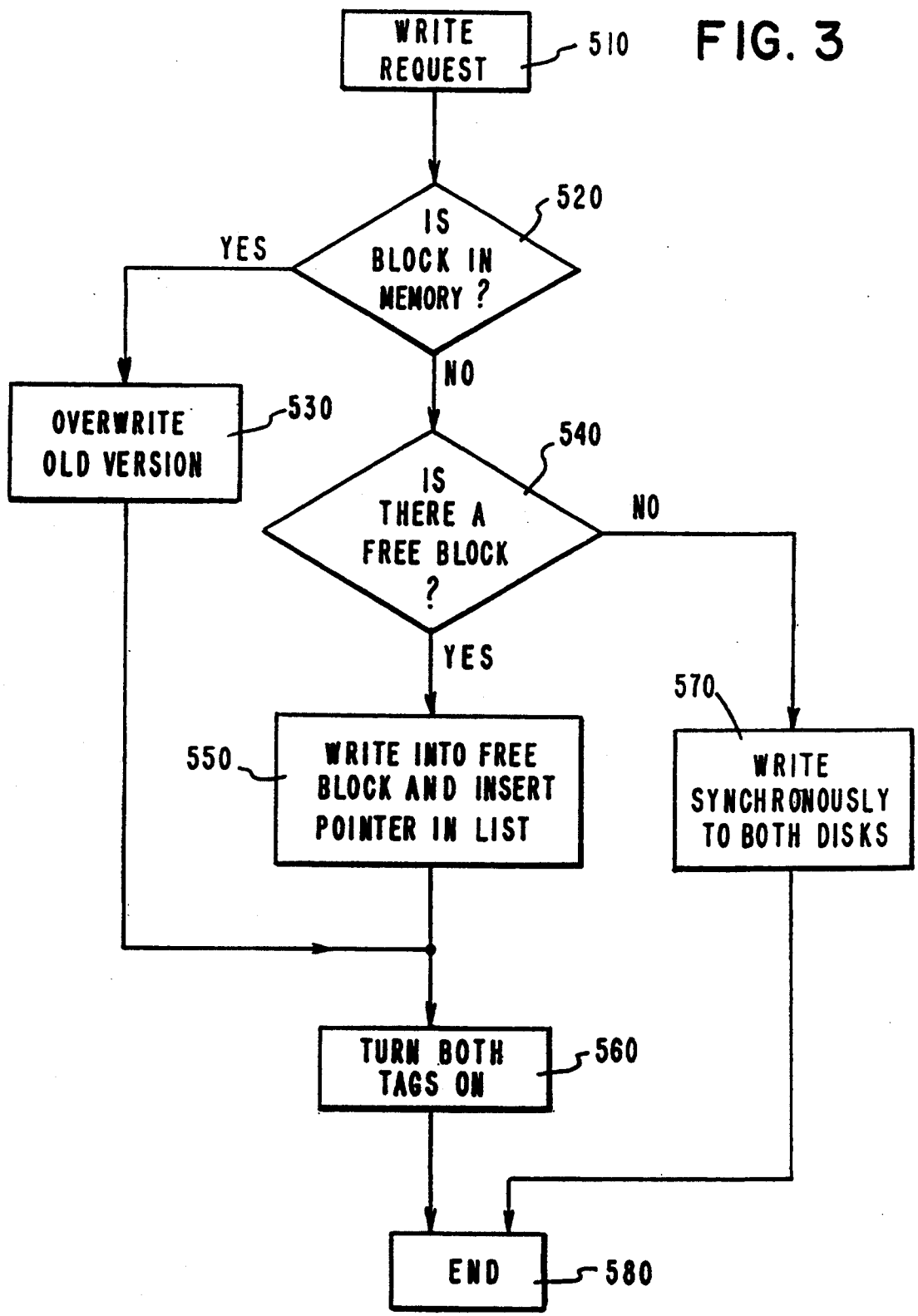
FIG. 3 is a flow chart which shows the steps involved in processing a write request during normal operation.

In the preferred subsystem in accordance with this invention, there are four processes occurring during normal operation. The first process services write requests and is shown in FIG. 3. When a write request arrives (block 510), the non-volatile memory in the controller is checked for the presence of an old version of that block (block 520 in FIG. 3). If the previous version of that block is already in the non-volatile memory region for the corresponding pair of disks, the previous version in memory is overwritten (block 530) and both tags corresponding to that block are turned on (block 560) to indicate that both disks must install the new version of that block.

If an old version of the block to be written is not found in the non-volatile memory, the controller looks for free space in its non-volatile memory in which to temporarily store the block to be written (block 540). If there is a free space for the block, the data block defined by the write request is written into the free space and a pointer to the new block is inserted into the pointer list (block 550) in a position (relative to other pointers in the list) such that the list represents a schedule for efficiently writing the pointed-to data blocks to disk. The corresponding tags are turned on to indicate that both disks must perform a write of the new data block (block 560).

If the data block to be written is not in the non-volatile memory and there is no free block space available, the new block is written synchronously to both disks (block 570). This situation will not occur normally (other than maybe for loads and other very large copying operations) if the non-volatile memory is large enough to absorb heavy bursts of write activity, but the action to take in the event a write request is encountered and there is no free space in the non-volatile memory must be specified anyway.

The list of pointers 225 defines an order or schedule for the data blocks (in the non-volatile memory) covered by that list. This order or schedule is created preferably such that if a disk accesses the blocks in that order, the total time to access all the blocks (and write them to disk) will be minimized. As a first approximation, the ordering may be by cylinder, so that a scan (sweep) through the entire disk can apply all updates in one pass. All blocks in a particular cylinder are written before moving on to the next cylinder. More elaborate schemes could order the blocks within a cylinder to minimize the rotation latency for the cylinder. More sophisticated schemes may take into account the combination of seek time and rotational delay. Such schemes are described, for example, by M. Seltzer et al. in "Disk Scheduling Revisited", Winter 1990 USENIX, pp. 313–323, Washington, D.C. (Jan. 1990).

Figure 4:
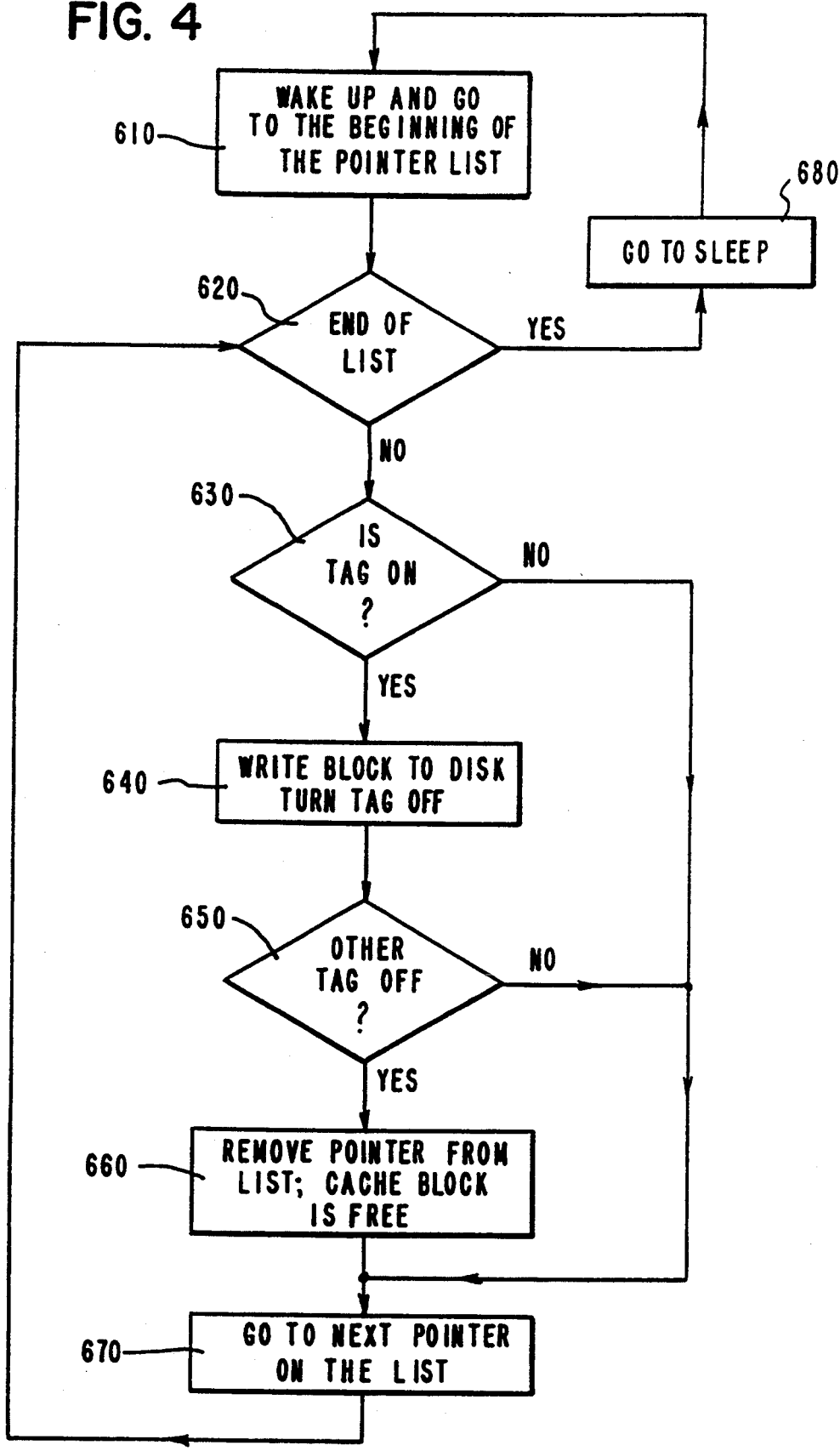
FIG. 4 is a flow chart which shows the steps involved in the process of applying a batch of writes to a disk during normal operation.

There are two processes (one for each disk), which periodically wake up and apply the updates pending in non-volatile memory to the corresponding disk. The logic for applying the updates is identical for the two processes and is shown in FIG. 4. When the process wakes up (block 610), it goes to the beginning of the pointer list and traverses the pointer list examining each block in order. In each step it checks to see if it has reached the end of the list (block 620). If so, it goes to sleep (block 680) and wakes up for the next period. If there are more blocks, it checks the tag of the current block in the pointer list (block 630). If the tag corresponding to the process's disk is off, the process moves to the next pointer in the list (block 670). If the tag is on, the process writes the block on disk and turns the tag off (block 640). After turning the tag off, it checks the other tag (block 650). If the other tag is on, the process moves to the next pointer in the list (block 670). If the other tag is off, both disks have applied the update, so the pointer is removed from the list (block 660). The block is still valid (a read to that block will still get a cache hit), but it is free and can be overwritten by a subsequent write of any block. Then the process moves to the next pointer in the list (block 670).

Figure 5:
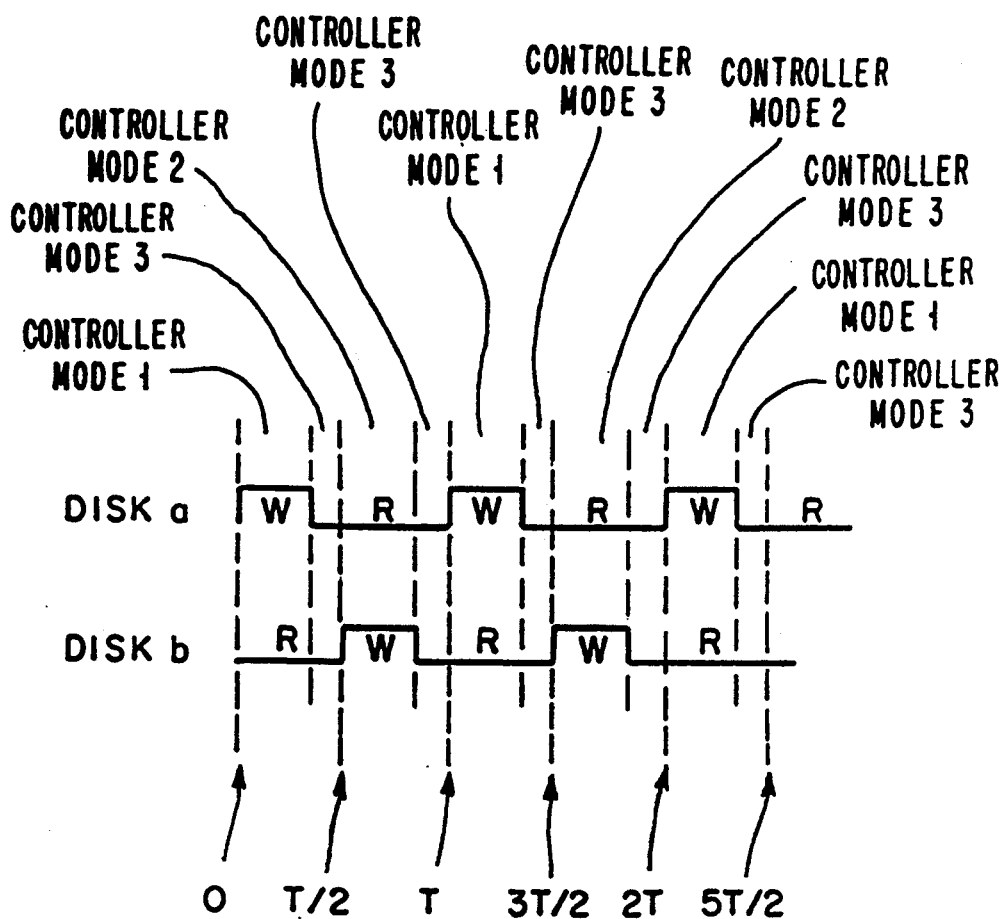
FIG. 5 is a timing diagram which shows the timing relation between the two processes applying write batches to two mirrored disks.

The two processes applying the updates to the two disks have the same logic and preferably the same period, i.e., the time that elapses between two consecutive activations of the write phase of the process preferably is the same for the two processes. This period is called T in the described embodiment. The two processes need not be synchronized, but they are illustrated at a phase difference of 180 degrees in FIG. 5. The process for disk a wakes up at times 0, T, 2T, 3T etc., and begins to write a batch of updates to a disk a until completed and then switches to read mode, while the process for disk b wakes up at times T/2, T+T/2, 2T+T/2, 3T+T/2, etc., and begins to write a batch of updates to disk b until completed and then switches to read mode. FIG. 5 illustrates this with a timing diagram, where the high value indicates time periods during which the writing process is active for the corresponding disk. While the writing process is asleep (inactive), the corresponding disk may service random read traffic.

As illustrated in FIG. 5, this results in three different controller modes, namely controller mode 1 where disk a is in write mode and disk b is in read mode, controller mode 2 where disk b is in write mode and disk a is in read mode, and controller mode 3 where both disk a and disk b are in read mode. As mentioned earlier in connection with the description of block 570 of FIG. 3, there is also a controller mode 4 where both disk a and disk b are in write mode. Controller mode 4 cannot occur so long as the batch write completes each time in less than time T/2. The system is preferably designed so that the situation where both disks are in write mode simultaneously is largely avoided, which is done by making the design such that batch writes will complete in less than time T/2.

Keeping the two processes at phase difference of 180 degrees ensures that if writes can be applied in less than half a period, there is always one disk arm dedicated to servicing random reads, which allows batches to become large (so that writes can gain efficiency), without hurting response time for reads. The period T is a system-dependent parameter, primarily determined by the amount of memory available, since the writes accumulating in a period T should fit in memory.

The logic for the process servicing read requests is shown in FIG. 6. When a read request arrives (block 810), the non-volatile memory is checked (block 820) for the presence of the block to be read. If the block is in memory, it is returned immediately (block 830). If it is not in memory, a check is made (block 840) as to whether both disks are currently servicing read requests (i.e., whether the controller is in controller mode 3). If not, the request is served by the disk that is currently in read-only mode (block 850), i.e., the disk whose write process is inactive. If both disks are in read-only mode (i.e., controller mode 3), the request may be serviced by either disk, but preferably will be serviced by the disk whose heads are closest to the target block (block 860).

Those skilled in the art will readily appreciate that some routine synchronization (e.g., latching) is required to preserve the integrity of the shared data structures (e.g., tags, pointer list) accessed simultaneously by more than one of the above processes. Also, the pointer order that minimizes the time to write a batch may be different for the two disks, since each disk generally writes to a disk a different subset of the blocks stored in the non-volatile memory.

Figure 7:
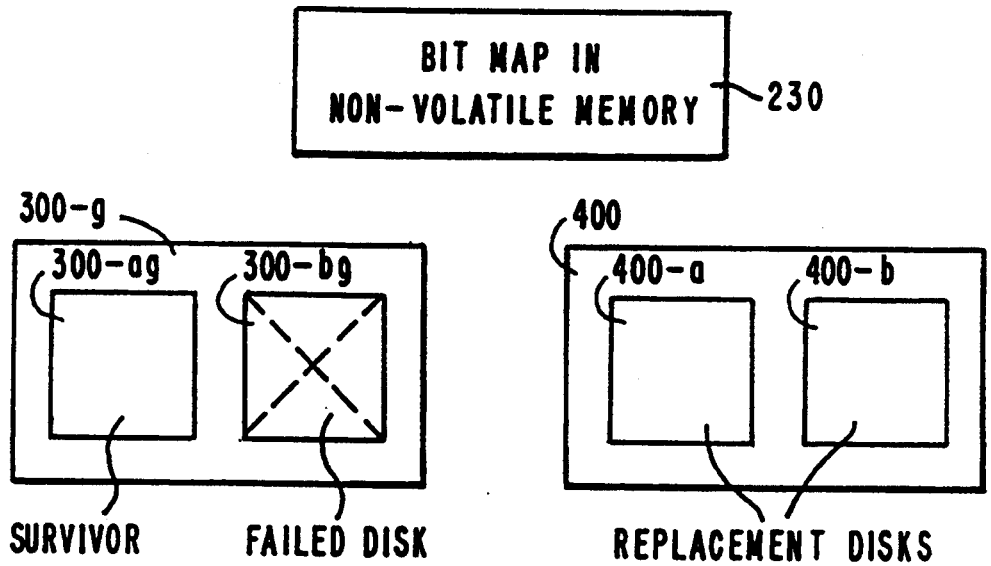
FIG. 7 schematically illustrates the configuration during recovery of a failed disk.

Operation under a failure scenario will now be described and is illustrated in FIG. 7. Assume that disk 300-bg in mirrored pair 300-g fails. Traditional recovery schemes use one replacement disk, onto which the contents of the surviving disk 300-ag are copied to replace the lost mirrored disk and therefore restore the mirrored pair. The preferred recovery scheme in accordance with this invention utilizes a pair of replacement disks 400a and 400b, rather than just a single replacement disk. When recovery completes, the disks in pair 400 are up-to-date, and the survivor 300-ag is returned to the system for other use.

For the duration of recovery, the survivor stays in read-only mode. The survivor does not get involved in servicing writes. Those skilled in the art will readily appreciate that a bit map (labeled 230 in FIG. 7) stored in the non-volatile memory can be used to keep track of which blocks remain to be retrieved from the survivor before recovery completes. The bit map has one bit per disk block and all bits are clear when recovery starts. Alternatively, the bit map can be stored in other memory components of the system.

Figure 8:
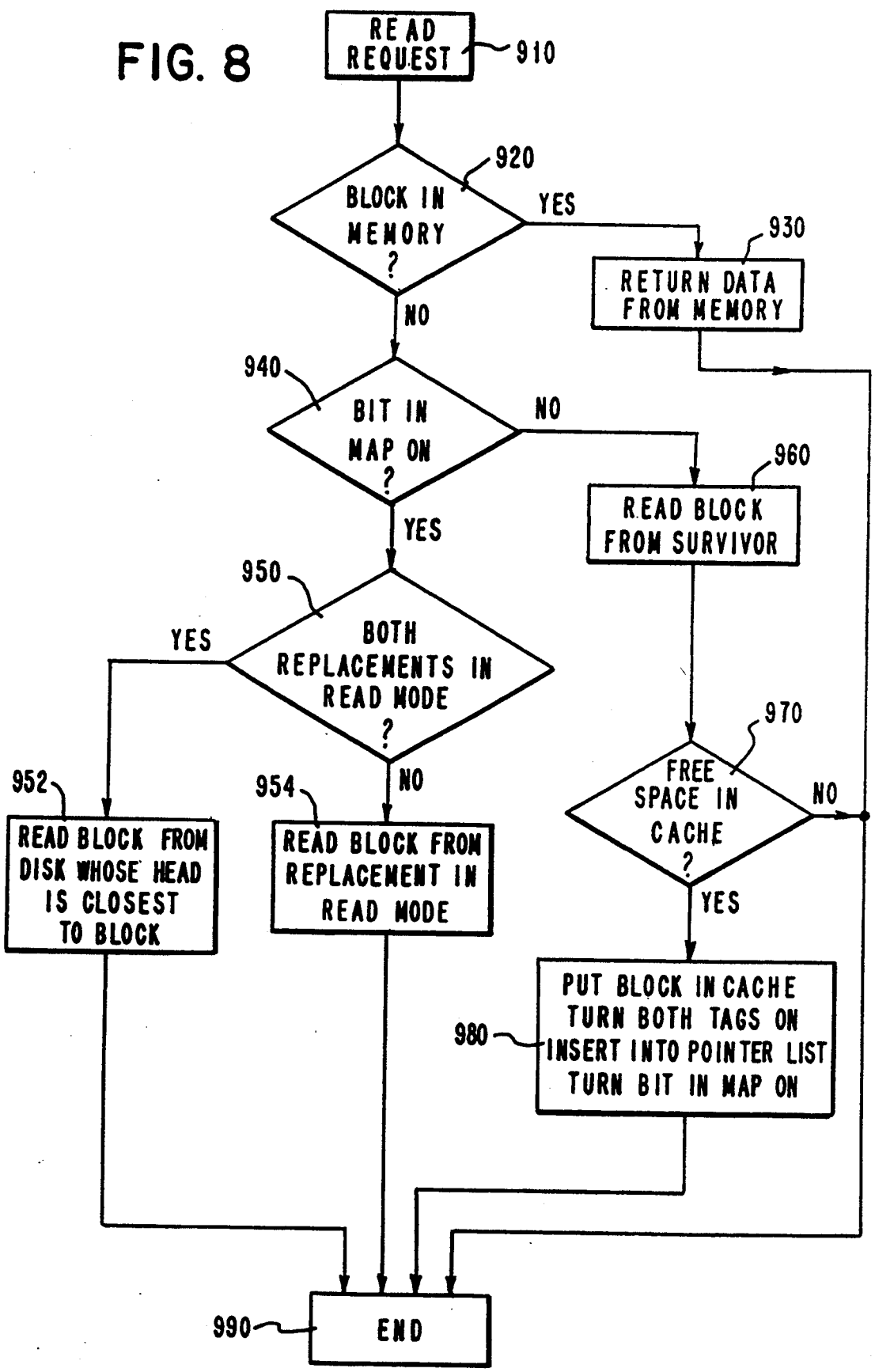
FIG. 8 is a flow chart which shows the steps involved in servicing a read request during recovery.

In total, there are five processes involved in recovery. Two of the processes (one for each disk) periodically wake up and apply writes pending in the cache to the corresponding disk. The processes have the same period and are maintained at a phase difference of 180 degrees. The logic of these processes is identical to that for normal operation shown in FIG. 4. The third process services reads and is shown in FIG. 8. When a read request arrives (block 910), the memory is checked (block 920) for the presence of the block to be read. If the block is present in memory, it is returned immediately (block 930). If the block is not in the non-volatile memory, it must be read from disk. The bit map is first checked to see if the block is available on the replacement disks (block 940). If not, the read is serviced by the survivor (block 960). After the block is read from the survivor, the process checks if there is free space in the non-volatile memory (block 970). If not, the process ends. If there is free space in the non-volatile memory, the block is also placed in the non-volatile memory, a pointer is inserted in the list and both tags are turned on (block 980), so that the disks will write it in their next write phase. Furthermore, the bit in the bit map corresponding to that block is turned on to indicate that there is no longer a need to extract that block from the survivor.

If on a read request the block is not in non-volatile memory and the bit map shows that the block is available on the replacement disks, the block is read from one of the replacements. The process preferably checks show many replacements are in read mode at that moment (block 950). If only one replacement is in read mode, the request is served by that replacement (block 954). If both replacements are in read mode, the request preferably is serviced by the disk whose arm is closest to the requested block (block 952). If the block is read from a replacement disk, there is no need to update the bit map or store the block in the cache.

The fourth process services writes during recovery and involves exactly the same steps shown in FIG. 3. In addition, in all cases, the bit corresponding to the block written is set in the bit map (if not already set) to indicate that it is no longer necessary to copy that block from the survivor.

Figure 9:
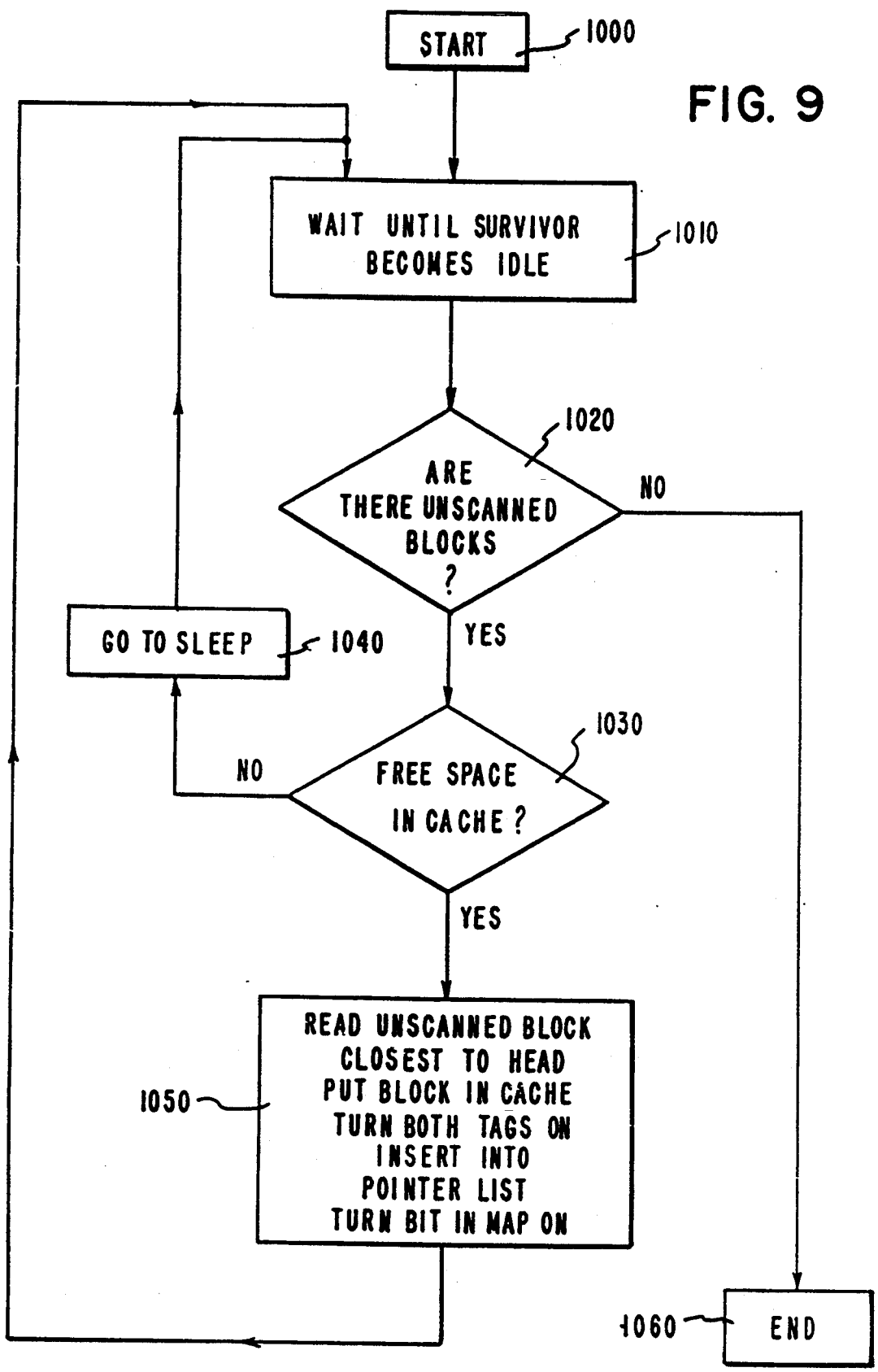
FIG. 9 is a flow chart which shows the steps involved in the background process that scans the survivor disk.

The fifth process (shown in FIG. 9) is a background process that scans the blocks in the survivor that have not yet been written on the replacements. The process is started (block 1000) when the system enters the recovery mode and the replacement disks are activated. The process waits until the survivor becomes idle (block 1010), i.e., until there are no random read requests pending for it. Then, it checks if there are unscanned blocks (block 1020), i.e., blocks for which the bit in the bit map has not been set. If all blocks have been scanned, recovery is complete and the process terminates (block 1060); the survivor can be returned to the system for other use. If there are unscanned blocks, the process checks if there is free space in the non-volatile memory (block 1030). If not, it goes to sleep (block 1040) for a certain interval. If there is free space in the non-volatile memory, the process reads the unscanned block which is closest to the current position of the survivor's head (block 1050). The bit map is used to determine which blocks are unscanned. The block read is placed in the non-volatile memory, and both of its tags are turned on to indicate that the replacements must write the block. A pointer is also inserted in the pointer list. Furthermore, the corresponding bit in the bit map is set to indicate that the survivor does not need to scan that block again. The process then repeats the above steps (goes to block 1010). If a random read arrives, the process is suspended in block 1010 until the read completes.

Those skilled in the art will readily appreciate that there are opportunistic strategies which the survivor disk can use to further expedite the recovery process. For example, whenever the survivor disk services a random read request, it could also read any unscanned (i.e., uncopied) blocks that happen to pass under its arm while it is waiting for the disk to rotate to the targeted block. Furthermore, the process shown in FIG. 9 obviously could read more than one block at a time.

We claim:

1. A fault-tolerant disk storage subsystem for storing data blocks of digital information for a computer system, comprising:

a mirrored pair of disks for storing data blocks of digital information in duplicate on both disks of said mirrored pair; and a controller for said mirrored pair of disks, said controller having a memory;, said controller comprising:

means for temporarily accumulating in said memory until storage thereof in duplicate on both disks of said mirrored pair a multiplicity of data blocks provided by said computer system as separate writes to the disk storage subsystem;

means for identifying each block stored in said memory that has not yet been stored on one disk of said pair and for identifying each block stored in said memory that has not yet been stored on the other disk of said pair;

means for sorting said accumulated data blocks that have not yet been stored on said one disk into an order that can be efficiently written onto said one disk in a batch run and for sorting said accumulated data blocks that have not yet been stored on said other disk into an order that can be efficiently written onto said other disk in another batch run;

means for providing a first mode of operation in which said one disk is in a write-only mode and said sorted accumulated data blocks that have not been stored on said one disk are written in batch mode onto said one disk, while said other disk serves said computer system in a read-only mode and writes from said computer system are received into said memory;

means for providing a second mode of operation in which said other disk is in a write-only mode and said sorted accumulated data blocks that have not been stored on said other disk are written in batch mode onto said other disk without interruption, while said one disk serves said computer system in a read-only mode and writes from said computer system are received into said memory;

means for operating said mirrored pair of disks in said first mode of operation during spaced time intervals and in said second mode of operation during at least a portion of the time between said spaced time intervals; and means for providing a requested data block to said computer system from said memory if said requested data block is in said memory, and otherwise from said other disk if said mirrored pair of disks is operating in said first mode of operation and from said one disk if said mirrored pair of disks is operating in said second mode of operation, whereby data blocks are written onto said mirrored pair of disks in sorted order in batched runs without interference from or with the reading of data blocks requested by said computer system.

2. A fault-tolerant disk storage subsystem as defined in claim 1 wherein said controller is implemented by software in said computer system and said memory of said controller is a portion of the general storage resources of said computer system.

3. A fault-tolerant disk storage subsystem as defined in claim 1 wherein said controller and memory are implemented with dedicated hardware.

4. A fault-tolerant disk storage subsystem as defined in claim 1 wherein said memory is non-volatile.

5. A fault-tolerant disk storage subsystem as defined in claim 1 wherein said memory is fault-tolerant.

6. A fault-tolerant disk storage subsystem as defined in claim 1 wherein said means for operating said mirrored pair of disks in said first mode of operation schedules said first mode of operation to start periodically.

7. A fault-tolerant disk storage subsystem as defined in claim 1 wherein said means for sorting said accumulated data blocks sorts said data blocks into an order which corresponds to a physical scan of an entire disk.

8. A fault-tolerant disk storage subsystem as defined in claim 1 wherein said controller includes means for making a single scan through said accumulated data blocks that have not yet been stored on said one disk in sorted order during said first mode of operation before changing modes.

9. A fault-tolerant disk storage subsystem as defined in claim 1 wherein said controller further includes means for providing a third mode of operation during which both of said disks of said mirrored pair are in read mode and a requested data block may be retrieved from either of said disks of said mirrored pair in the event said requested data block is not in said memory.

10. A fault-tolerant disk storage subsystem as defined in claim 1 wherein said controller further includes means for operating said mirrored pair of disks in said third mode of operation whenever said first mode of operation is terminated prior to a next scheduled start of said second mode of operation and whenever said second mode of operation is terminated prior to a next scheduled start of said first mode of operation.

11. A fault-tolerant disk storage subsystem as defined in claim 9 wherein said controller includes means for determining during said third mode of operation, when a data block is requested by said computer system and is not present in said memory, which one of said disks in said mirrored pair can deliver said requested data block in the shortest time and means for retrieving said requested data block from said determined disk.

12. A fault-tolerant disk storage subsystem as defined in claim 1 wherein said controller further includes means for providing a third mode of operation during which both of said disks of said mirrored pair are operated in write mode.

13. A fault-tolerant disk storage subsystem as defined in claim 12 wherein said controller further includes means for operating said mirrored pair of disks in said third mode of operation whenever all accumulated data blocks that have not been stored on said one disk at the start of said first mode of operation have not been written to said one disk by the time said second mode of operation is scheduled to start again and whenever all accumulated data blocks that have not been stored on said other disk at the start of said second mode of operation have not been written to said other disk by the time said first mode of operation is scheduled to start again.

14. A fault-tolerant disk storage subsystem as defined in claim 1 wherein said subsystem includes a spare pair of storage disks and said controller includes means for augmenting said mirrored pair of storage disks with said spare pair of storage disks during a recovery mode of operation in the event that only one of said disks of said mirrored pair remains operational.

15. A fault-tolerant disk storage subsystem as defined in claim 14 wherein said controller includes means for placing said disk of said mirrored pair which remains operational in read-only mode continuously during said recovery mode of operation until all blocks on said remaining operational disk have been transferred either to said memory or to one or both of the disks of said spare pair, and means for replacing said mirrored pair with said spare pair when all blocks on said remaining operational disk of said mirrored pair have been transferred.

16. A method of storing data blocks of digital information received from a computer system in a storage subsystem having a mirrored pair of storage disks and for retrieving data blocks from said storage subsystem upon request from said computer system, comprising the steps of:

temporarily accumulating a group of data blocks received from said computer system in the form of separate writes as batches of data blocks to be stored;

sorting said accumulated data blocks in each batch in an order for efficient batch writing said mirrored pair of disks;

operating said mirrored pair of disks in a first mode of operation in which one disk of said mirrored pair is in write-only mode while the other disk of said mirrored pair is in read-only mode and in a second mode of operation in which said one disk is in read-only mode while said other disk is in write-only mode;

copying onto said one disk during said first mode of operation a batch of accumulated and sorted data blocks in said accumulated group that have not been already written to said one disk;

copying onto said other disk during said second mode of operation a batch of accumulated and sorted data blocks in said accumulated group that have not been already written to said other disk;

operating said mirrored pair of disks in said first mode of operation during spaced time intervals and in said second mode of operation during at least a portion of the time between said spaced time intervals; and retrieving a data block requested by said computer system from said accumulated group of data blocks if said requested data block is in said accumulated group, and otherwise from said other disk if said mirrored pair of disks is operating in said first mode of operation and from said one disk if said mirrored pair of disks is operating in said second mode of operation, whereby data blocks are written onto said mirrored pair of disks in sorted order without interference from or with the reading of data blocks requested by said computer system.

17. A method of storing data blocks of digital information as defined in claim 16 and further comprising the step of deleting from said accumulated group any data blocks that have been written to both of said disks of said mirrored pair.

18. A method as defined in claim 17 and further comprising the step of associating first and second flags with each accumulated data block in said group, said first flag associated with any particular data group indicating whether or not said particular data group has been copied to said one disk and said second flag associated with said particular data group indicating whether or not said particular data group has been copied to said other disk.

* * * * *